United States Patent [19]

Thrap

[11] 4,091,333
[45] May 23, 1978

[54] TRANSCONDUCTANCE AMPLIFIER CIRCUIT

[75] Inventor: Guy Carlyle Thrap, Del Mar, Calif.

[73] Assignee: Valhalla Scientific Incorporated, San Diego, Calif.

[21] Appl. No.: 818,398

[22] Filed: Jul. 25, 1977

[51] Int. Cl.² ............................................. H03F 1/34
[52] U.S. Cl. ...................................... 330/100; 330/86; 330/104; 330/108; 330/110; 330/112
[58] Field of Search ............... 330/69, 86, 100, 103, 330/104, 108, 110, 112, 258, 260, 291, 293; 307/230

[56] References Cited

U.S. PATENT DOCUMENTS 3,805,145  4/1974  Gordon ........................... 330/110 X Primary Examiner—James B. Mullins
Attorney, Agent, or Firm—Brown & Martin

[57] ABSTRACT

A transconductance amplifier circuit including two operational amplifiers, as shown in the accompanying drawing, is disclosed. The gain of the amplifier circuit is determined by the resistances R1, R2, R3 and R4. The scale factor relating the output current $i_{out}$ to the input voltage $e_{in}$ is determined by the setting of the switches S1, S2, and S3, which adjust the amount of resistance between the output current terminal $I_o$ and the output terminal of the second operational amplifier A2. For R1/R2 = 1; R3/R4 = 1; and switch S1 closed $i_{out} = e_{in}/R5$. This transconductance amplifier circuit provides common mode rejection between the input voltage and the output current.

2 Claims, 3 Drawing Figures

TRANSCONDUCTANCE AMPLIFIER CIRCUIT

BACKGROUND OF THE INVENTION

The present invention pertains to an improved transconductance amplifier circuit.

A transconductance amplifier circuit provides an output current that is proportional to its input voltage.

One prior art transconductance amplifier circuit which provides a precise relationship between the output current and the input voltage is shown in FIG. 1. This circuit includes an operational amplifier A; a D.C. voltage source V completing the negative feedback loop between output terminal of the operational amplifier A and inverting input terminal of the operational amplifier A; and a resistance R completing the positive feedback loop between the output terminal of the operational amplifier and the non-inverting input terminal of the operational amplifier A. An operational amplifier characeristically has a sufficiently high input impedance that any current flow at its input terminals is effectively negligible. Accodingly there is in effect no current flow between the current output terminal I and the non-inverting input terminal of the operational amplifier A, whereby the amount of current $i_{out}$ flowing through the load resistance $R_L$ to circuit ground potential is proportional to the voltage V. $i_{out} = V/R$. The operational amplifier A must include an output stage containing a current amplifier capable of delivering a current of the desired magnitude and in accordance with the magnitudes of the circuit components V and R. With a battery provided as the voltage source V, the output current terminal I is in effect a constant current source.

The prior art circuit of FIG. 1 is somewhat limited in utility in that the voltage source V must float above circuit ground and it must be dedicated (i.e. the voltage source cannot be used for any other purpose within an overall larger circuit including the transconductance amplifier circuit of FIG. 1 as a component). The preciseness of the constant current source at output current terminal I is dependent upon the preciseness of the battery dedicated to the voltage source V. Also there is a capacitive effect between the voltage source V and circuit ground which limits the frequency response of the circuit of FIG. 1.

Another prior art transconductance amplifier circuit is shown in FIG. 2. The inverting input terminal of an operational amplifier B is connected to ground potential through a resistance RA. A resistane RB connects the input voltage source E to the non-inverting input terminal of the operational amplifier B. The negative feedback loop of the operational amplifier B is completed by a resistance RC; and the positive feedback loop is completed by the resistance RD. The output current $i_{out}$ is provided from the junction of the resistances RB and RD. For this circuit when RD·RD = RA·RD then:

$i_{out} = E (RA·RD/RA·RB·RD)$.

With this transconductive amplifier circuit the voltage source E must have the capability of the delivering of a current of the desired magnitude. Also in order to change the scale factor defining the relationship between the output current $i_{out}$ and the input voltage E it is necessary that means be provided for changing the values of both resistance RB and resistance RD.

Other prior art transconductance amplifier circuits include current to voltage transformers in their output stages to sense current flow and then convert the sensed current to a voltage signal so as to provide a feedback signal. These cicuits are generally quite complicated and not particularly accurate, and are capable of responding to only AC input voltage signals.

SUMMARY OF THE INVENTION

The present invention is an improved transconductance amplifier circuit. The transconductance amplifier of the present invention includes first and second input voltage terminals; an output current terminal; a first operational amplifier; having inverting and non-inverting terminals and an output terminal; a second operational amplifier having inverting and non-inverting input terminals and an output terminal, with the inverting input terminal of the second operational amplifier being connected to the output terminal of the first operational amplifier; a first resistance connected between the first input voltage terminal and the non-inverting input terminal of the first operational amplifier; a second resistance connected between the output terminal of the second operational amplifier and the non-inverting input terminal of the first operational amplifier; a third resistance connected between the second input voltage terminal and the inverting input terminal of the first operational amplifier; a fourth resistance connected between the output terminal of the first operational amplifier and the inverting input terminal of the first operational amplifier; and a fifth resistance connected between the output terminal of the second operational amplifier and the non-inverting input terminal of the second operational amplifier; and also connected between the output terminal of the second operational amplifier and the output current terminal.

The second resistance completes both the positive feedback loop for the first operational amplifier and the negative feedback loop for the second operational amplifier. The negative feedback loop for the first operational amplifier is completed by the fourth resistance; and the positive feedback loop for the second operational amplifier includes the fifth resistance.

In the transconductance amplifier circuit of the present invention the operation of the operational amplifier is such that whenever there is a difference in the voltage levels applied to its two input terminals, the voltage level at its output terminal changes so as to effect through its feedback loops an equalization of the voltage levels applied to the input terminals. Because of the high input impedances of the operational amplifiers, there is effectively no current flow between the output current terminal and the non-inverting input terminal of the second operational amplifier. Accordingly the output current is proportional to the input voltage divided by the value of the total resistance between the output current terminal and the output terminal of the second operational amplifier. This total resistance includes the fifth resistance.

By merely adjusting the resistance between the output current terminal and the output terminal of the second operational amplifier, it is possible to readily adjust the scale factor of the transconductance amplifier circuit. This scale factor relates the output current to the input voltage.

In the preferred embodiment the transconductance amplifier circuit of the present invention further includes a sixth resistance and switching means connected between the fifth resistance and the output current terminal for adjusting the total resistance between the output current terminal and the output terminal of the second operational amplifier in accordance with the setting of the switching means.

Another feature of the transconductance amplifier of the present invention is that its application is not restricted by imposing requirements as to the nature of the input voltage source provided to it by the overall circuit in which the transconductance amplifier circuit is used. The input voltage source may be either AC or DC and does not have to be grounded, floated above circuit ground, shielded or otherwise guarded. The voltage source does not have to be capable of delivering an output current of the magnitude desired or in accordance with the circuit components. The desired current level is enabled by including a current amplifier in the output stage of the second operational amplifier. Also the transconductance amplifier circuit of the present invention provides a high input impedance to the input voltage source. Accordingly the circuit of the present invention may be used with whatever voltage sources as may be available in the overall circuit in which the circuit of the present invention is included.

The circuit of the present invention also provides common mode rejection between the output current and the input voltage, which is particularly important in those applications where the input voltage source is not grounded.

DESCRIPTION OF THE PREFERRED EMBODIMENT

Figure 1:
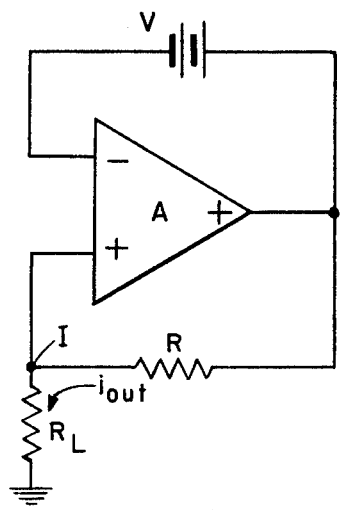
FIG. 1 is a schematic circuit diagram of one prior art transconductance amplifier circuit.
Figure 2:
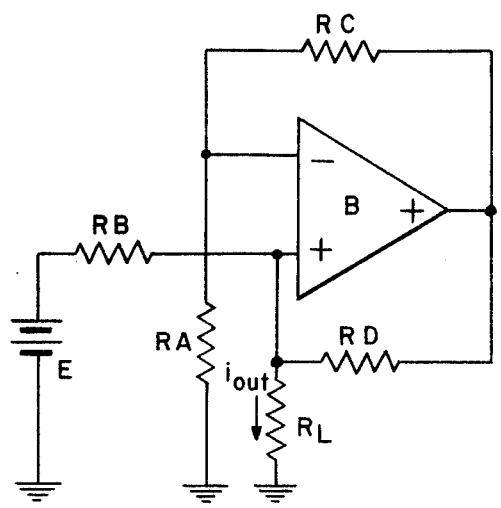
FIG. 2 is a schematic circuit diagram of a second prior art transconductance amplifier circuit.
Figure 3:
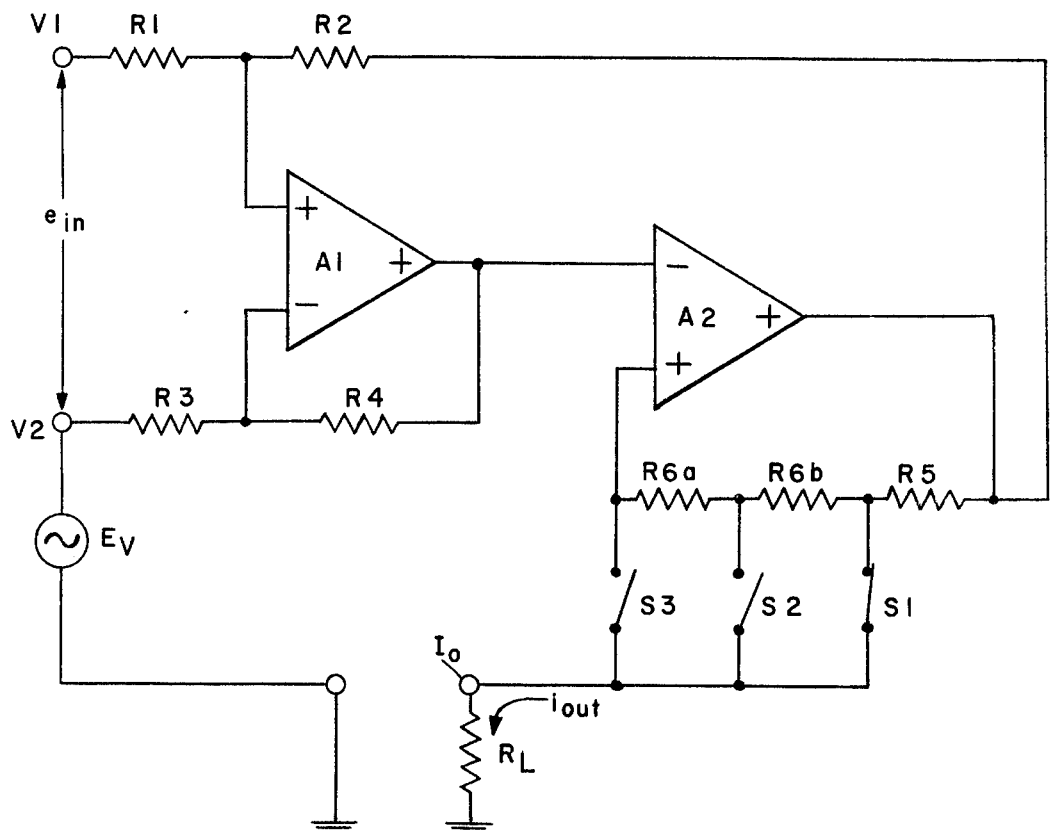
FIG. 3 is a schematic circuit diagram showing the transconductance amplifier circuit of the present invention.

The preferred embodiment of the transconductane amplifier circuit of the present invention is described with reference to FIG. 3. The transconductance amplifier includes two operational amplifiers A1, A2 with the inverting input terminal of the second operational amplifier A2 being connected to the output terminal of the first operational amplifier A1. A pair of input voltage terminals V1, V2 are respectively connected through a pair of resistances R1 and R3 to the non-inverting and inverting input terminals of the first operational amplifier A1.

The negative feedback loop for the second operational amplifier A2 and the positive feedback loop for the first operational amplifier A1 are both completed by a resistance R2 connected between the output of the second operational amplifier A2 and non-inverting input terminal of the first operational amplifier A1. The positive feedback loop for the first operational amplifier A1 is completed by a resistance R4 connected between the output terminal of the first operational amplifier A1 and the inverting input terminal of the first operational amplifier A1. The positive feedback loop for the second operational amplifier A2 is completed by the resistances R5, R6a and R6b connected between the output terminal of the second operational amplifier A2 and the non-inverting input terminal of the second operational amplifier A2.

An output current terminal $I_o$ is connected to the output terminal of the second operational amplifier A2 through the resistance R5. The output current $i_{out}$ provided at the output current terminal $I_o$ flows through a load resistance $R_L$ to circuit ground.

Switches S1, S2 and S3 and resistances R6a and R6b are provided for adjusting the total resistance between the output current terminal and the output terminal of the second operational amplifier A2 in accordance with the setting of the switches S1, S2 and S3.

Neither input voltage terminal V1 or V2 is shown as connected directly to circuit ground. A variable voltage source $E_V$ is shown as connected between input voltage terminal V2 and circuit ground to illustrate a typical application of the transconductance amplifier circuit of the present invention.

The circuit of the present invention provides common mode rejection of the voltage of the variable voltage source $E_V$. The output current $i_{out}$ is unaffected by the voltage of the variable source $E_V$.

The operational amplifier A1 and A2 each include integrated circuit operational amplifiers. They have high input impedance and a low offset voltage. The second operational amplifier A2 also includes an output stage containing a number of emitter-follower transistor amplifiers for boosting the output current of the second operational amplifier A2 from the typical 1 ma current magnitude provided by an integrated circuit operational amplifier to whatever current level is desired for utilization of the transconductance amplifier circuit.

The gain of the transconductance amplifier circuit is determined by the values of the resistances R1, R2, R3 and R4. The scale factor of this circuit is determined by the values of the resistances R5, R6a and R6b and the setting of the switches S1, S2 and S3.

In an examplary embodiment of the transconductance amplifier circuit of the present invention, R1, R2, R3 and R4 are each a 100 kilohm resistance, R5 is a 1.000 ohm resistance, R6a is a 9.000 ohm resistance and R6b is a 90.000 ohm resistance.

Considering an example wherein only the switch S1 is closed, the load resistance $R_L$ is 2 ohms and the input voltage $e_{in}$ is 1.000 volt; since $R1/R2 = 1$ and $R3/R4 = 1$, the output current $i_{out} = e_{in}/R5$ (i.e., 1/1.000 = 1.000 ampere).

Because of the high input impedance of the second operatonal amplifier A2, there is effectively no current flow through the resistances R6a and R6b. In this example, the voltage levels throughout the circuit are as follows. With a 2 ohm load resistance $R_L$ and a 1 ampere output current $i_{out}$, the voltage level at the output current terminal $I_o$ is 2 volts, and the voltage level at the output terminal of the second operational amplifier is 3 volts. The operational amplifier A2 operates to equalize the voltage levels at its input terminals. Since the voltage level at the non-inverting input terminal of the second operational amplifier A2 is the same as the voltage level at the output current terminal, i.e., 2 volts, there is a 1 volt difference between the output terminals of the first and second operational amplifiers A1, A2.

For the same exemplary circuit, with switch S2 closed and switches S1 and S3 open, the output current $i_{out}$ equals $e_{in}$ divided by the sum of resistances R5 and R6a, 1,000 volt/(1.000 + 9.000) ohms = 100 milliamperes.

The transconductance amplifier circuit of the present invention is useful in a circuit wherein it is desirable to operate a constant current source from a reference voltage source in a digital voltmeter. In such a circuit a drift which occurs in the reference voltage affects the digital voltmeter identically with the constant current source thereby cancelling the effect of the drift. This technique is particularly useful in a multimeter wherein a constant current source is used in conjunction with a digital voltmeter to measure resistance.

Having described my invention, I now claim:

1. A transconductance amplifier circuit, comprising
first and second input voltage terminals;
an output current terminal;
a first operational amplifier having inverting and non-inverting input terminals and an output terminal;
a second operational amplifier having inverting and non-inverting input terminals and an output terminal, with the inverting input terminal of the second operational amplifier being connected to the terminal of the first operational amplifier;
a first resistance connected between the first input voltage terminal and the non-inverting input terminal of the first operational amplifier;
a second resistance connected between the output terminal of the second operational amplifier and the non-inverting input terminal of the first operational amplifier;
a third resistance connected between the second input voltage terminal and the inverting input terminal of the first operational amplifier;
a fourth resistance connected between the output terminal of the first operational amplifier and the inverting input terminal of the first operational amplifier;
a fifth resistance connected between the output terminal of the second operational amplifier and the non-inverting input terminal of the second operational amplifier, and also connected between the output terminal of the second operational amplifier and the output current terminal.

2. A transconductance amplifier circuit according to claim 1, further comprising
a sixth resistance and switching means connected between the fifth resistance and the output current terminal for adjusting the total resistance between the output current terminal and the output terminal of the second operational amplifier in accordance with the setting of the switching means.

* * * * *

UNITED STATES PATENT AND TRADEMARK OFFICE
CERTIFICATE OF CORRECTION

PATENT NO. : 4,091,333

DATED : May 23, 1978

INVENTOR(S) : Guy Carlyle Thrap

It is certified that error appears in the above-identified patent and that said Letters Patent are hereby corrected as shown below:

Column 5, line 18, after "the", insert --output--.

Signed and Sealed this

Seventeenth Day of June 1980

[SEAL]

Attest:

SIDNEY A. DIAMOND

Attesting Officer

Commissioner of Patents and Trademarks